(12) United States Patent
Ching et al.

(10) Patent No.: US 8,242,551 B2
(45) Date of Patent: Aug. 14, 2012

(54) METAL-INSULATOR-METAL STRUCTURE FOR SYSTEM-ON-CHIP TECHNOLOGY

(75) Inventors: Kuo-Cheng Ching, Zhubei (TW); Kuo-Chi Tu, Hsin-Chu (TW); Chun-Yao Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 149 days.

(21) Appl. No.: 12/397,948

(22) Filed: Mar. 4, 2009

(65) Prior Publication Data

US 2010/0224925 A1    Sep. 9, 2010

(51) Int. Cl.
*H01G 4/40* (2006.01)
*H01G 17/00* (2006.01)

(52) U.S. Cl. ........ 257/309; 257/301; 257/303; 257/306; 257/E21.014; 438/253; 438/398

(58) Field of Classification Search .................... 257/309
See application file for complete search history.

(56) References Cited

U.S. PATENT DOCUMENTS

| | | | |
|---|---|---|---|
| 6,294,420 B1 * | 9/2001 | Tsu et al. ....................... 438/239 |
| 6,329,234 B1 | 12/2001 | Ma et al. | |
| 6,472,721 B2 | 10/2002 | Ma et al. | |
| 6,656,785 B2 | 12/2003 | Chiang et al. | |
| 6,670,237 B1 | 12/2003 | Loh et al. | |
| 6,677,250 B2 | 1/2004 | Campbell et al. | |
| 6,825,080 B1 | 11/2004 | Yang et al. | |
| 6,849,387 B2 | 2/2005 | Chiang et al. | |
| 6,875,655 B2 | 4/2005 | Lin et al. | |
| 7,074,669 B2 | 7/2006 | Iijima et al. | |
| 7,105,405 B2 | 9/2006 | Schuegraf | |
| 7,122,424 B2 | 10/2006 | Tu et al. | |
| 7,163,853 B2 | 1/2007 | Tu | |
| 7,276,751 B2 | 10/2007 | Ho et al. | |
| 2003/0213989 A1 * | 11/2003 | Delpech et al. ............... 257/301 |
| 2004/0201053 A1 * | 10/2004 | Tu et al. ........................ 257/296 |
| 2005/0024979 A1 * | 2/2005 | Kim et al. ..................... 365/232 |
| 2005/0258512 A1 * | 11/2005 | Tu ................. 257/534 |
| 2007/0158714 A1 * | 7/2007 | Eshun et al. .................. 257/295 |
| 2007/0200162 A1 * | 8/2007 | Tu et al. ........................ 257/314 |
| 2008/0213967 A1 * | 9/2008 | Su et al. ........................ 438/386 |
| 2009/0140386 A1 * | 6/2009 | Inoue et al. ................... 257/532 |
| 2010/0013047 A1 * | 1/2010 | Thies et al. ................... 257/532 |
| 2010/0155801 A1 * | 6/2010 | Doyle et al. .................. 257/301 |
| 2010/0237465 A1 * | 9/2010 | Stribley et al. ................ 257/532 |

OTHER PUBLICATIONS

R. Mahnkopf et al., "'System on a Chip' Technology Platform for 0.18um Digital, Mixed Signal & eDRAM Applications", 0-7803-5410-9/99, 1999 IEEE, IEDM 99-849-852.

(Continued)

*Primary Examiner* — N Drew Richards
*Assistant Examiner* — Peter Bradford
(74) *Attorney, Agent, or Firm* — Haynes and Boone, LLP

(57) ABSTRACT

The present disclosure provides a semiconductor device that includes a semiconductor substrate, an isolation structure formed in the semiconductor substrate, a conductive layer formed over the isolation structure, and a metal-insulator-metal (MIM) capacitor formed over the isolation structure. The MIM capacitor has a crown shape that includes a top electrode, a first bottom electrode, and a dielectric disposed between the top electrode and the first bottom electrode, the first bottom electrode extending at least to a top surface of the conductive layer.

20 Claims, 18 Drawing Sheets

OTHER PUBLICATIONS

T. Schiml et al., "A 0.13um CMOS Platform with Cu/Low-k Interconnects for System on Chip Applications", 2001 Symposium on VLSI Technology Digest of Technical Papers, 4-89114-012-7/01, pp. 101-102.

K. Miyashita et al., "A High Performance 100 nm Generation SOC Technology [CMOS IV] for High Density Embedded Memory and Mixed Signal LSIs", 2001 Symposium on VLSI Technology Digest of Technical Papers, 4-89114-013-5/00, 2001 IEEE, 2 pages.

M. Thomas et al., "Reliable 3D Damascene MIM Architecture Embedded into CU Interconnect for a Ta2O5 Capacitor Record Density of 17fF/um2", 2007 Symposium on VLSI Technology Digest of Technical Papers, 978-4-900784-03-1, pp. 58-59.

* cited by examiner

US 8,242,551 B2

METAL-INSULATOR-METAL STRUCTURE FOR SYSTEM-ON-CHIP TECHNOLOGY

BACKGROUND

The present disclosure is related generally to the fabrication of semiconductor devices, and, more particularly, to a metal-insulator-metal (MIM) structure, a method of manufacturing the structure, and a semiconductor device incorporating the structure.

Capacitors are critical components for many data manipulation and data storage applications. In general, capacitors include two conductive electrodes on opposing sides of a dielectric or other insulating layer, and they may be categorized based on the materials employed to form the electrodes. For example, in a metal-insulator-metal (MIM) capacitor, the electrodes substantially comprise metal. MIM capacitors offer the advantage of a relatively constant value of capacitance over a relatively wide range of voltages applied thereto. MIM capacitors also exhibit a relatively small parasitic resistance.

Generally, it is desirable that MIM capacitors (and others) consume as little surface area as possible to increase packing density. At the same time, capacitance values should be maximized to obtain optimum device performance, such as when employed for data retention in dynamic random access memory (DRAM) applications or for decoupling in mixed-signal and microprocessor applications. However, capacitance values for a single capacitor generally decrease as the surface area of the capacitor decreases. Various structures have been proposed in attempt to overcome this dichotomy between minimizing capacitor structure size and maximizing capacitance values. One such example is a crown-shaped capacitor, which resembles a folded structure in which a trench is lined with a first electrode and filled with an annular shaped insulating element and an inner core electrode, thereby increasing the effective electrode contact area relative to conventional planar capacitors. Although crown capacitors have been satisfactory for its intended purpose, they have not been satisfactory in all respects.

DETAILED DESCRIPTION

Figure 1:
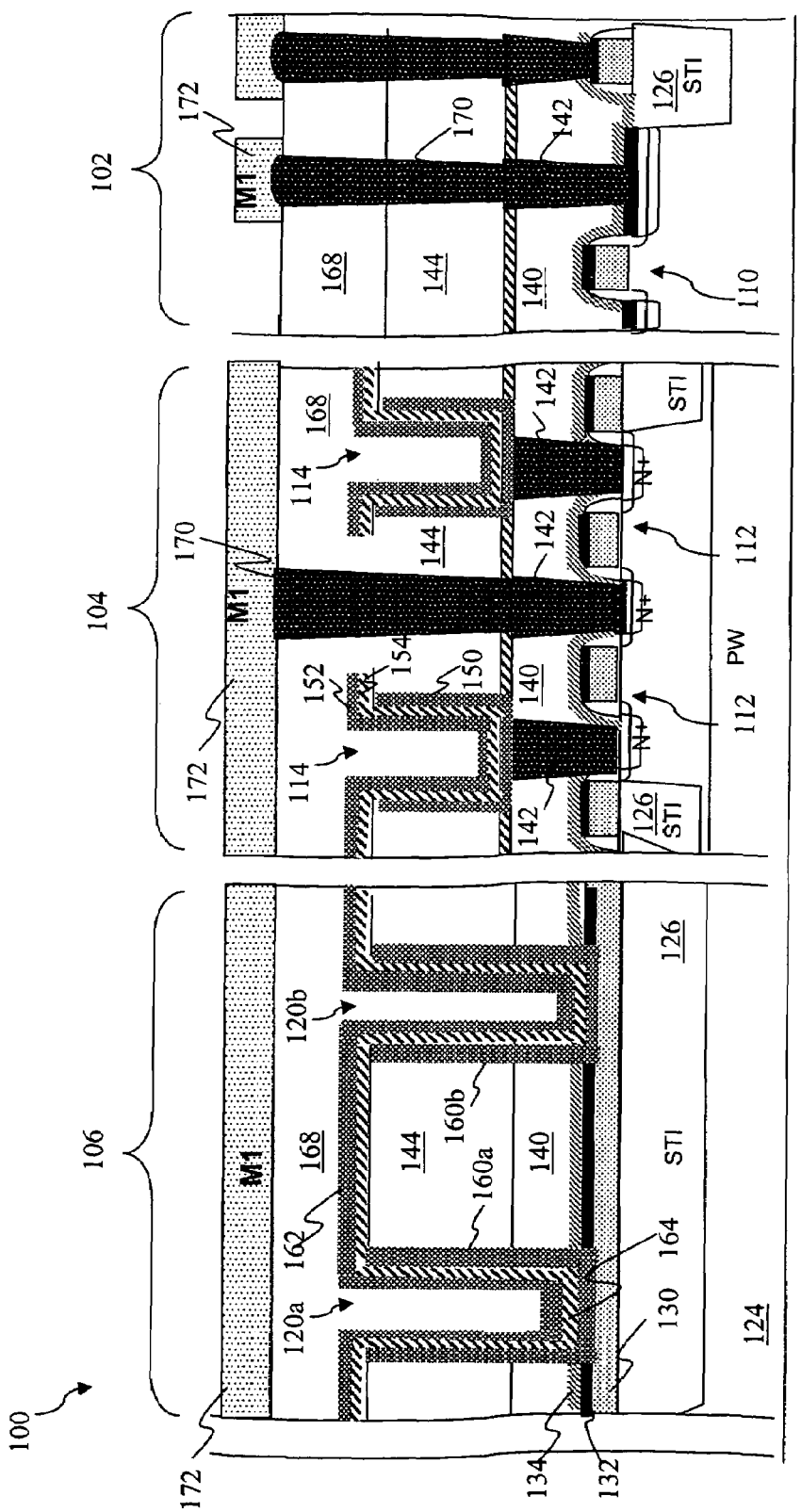
FIG. 1 illustrates a sectional view of a semiconductor device including a metal-insulator-metal (MIM) capacitor.

The present disclosure is related generally to the fabrication of semiconductor devices, and, more particularly, to a capacitor structure having a high unit capacitance, a method of manufacturing the structure and a semiconductor device incorporating the structure. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of a semiconductor device 100 including one embodiment of a metal-insulator-metal (MIM) capacitor. The semiconductor device 100 is configured as a system-on-chip (SoC) device that integrates various functions on a single chip. In the present embodiment, the semiconductor device 100 includes regions 102, 104, 106 that are each configured for a different function. The region 102 may include a plurality of transistors 110, such as metal oxide semiconductor field effect transistors (MOSFET) or complementary MOS (CMOS) transistors, and resistors that form a logic circuit, static random access memory (SRAM) circuit, processor circuit, or other suitable circuit. The region 104 may include a plurality of transistors 112 and capacitors 114 that form a dynamic random access memory (DRAM) array for memory storage. The region 106 may include a plurality of metal-insulator-metal (MIM) capacitors 120. The MIM capacitors 120 can be used for various functions such as for decoupling capacitance and high-frequency noise filters in mixed-signal applications, for decoupling capacitance in microprocessor applications, for storage retention in memory applications, and for oscillators, phase-shift networks, bypass filters, and coupling capacitance in radio frequency (RF) applications. It is understood that the semiconductor device 100 includes other features and structures such as eFuses, inductors, passivation layers, bonding pads, and packaging, but is simplified for the sake of simplicity and clarity.

The semiconductor device 100 may include a semiconductor substrate 124. In the present embodiment, the substrate 124 includes a silicon substrate (e.g., wafer) in a crystalline structure. The substrate 124 may include various doping configurations depending on design requirements as is known in the art (e.g., p-type substrate or n-type substrate). Additionally, the substrate 124 may include various doped regions such as p-type wells (p-wells or PW) or n-type wells (n-wells or NW). The substrate 124 may also include other elementary semiconductors such as germanium and diamond. Alternatively, the substrate 124 may include a compound semiconductor such as, silicon carbide, gallium arsenide, indium arsenide, or indium phosphide. Further, the substrate 124 may optionally include an epitaxial layer (epi layer), may be strained for performance enhancement, and may include a silicon-on-insulator (SOI) structure.

The semiconductor device 100 further includes isolation structures such as shallow trench isolation (STI) features 126 formed in the substrate 124 to isolate one or more devices. The STI features 126 may include silicon oxide, silicon nitride, silicon oxynitride, fluoride-doped silicate (FSG), and/ or a low-k dielectric material known in the art. Other isolation methods and/or features are possible in lieu of or in addition to STI. The STI features 126 may be formed using processes such as reactive ion etch (RIE) of the substrate 124 to form trenches which are then filled with an insulator material using deposition processes followed by a chemical-mechanical-polishing (CMP) process.

It is understood that formation of the transistors 110 in the region 102 and transistors 114 in the region 104 includes various processes known in the art, and thus are not described in detail herein. For example, various material layers, such as an oxide layer (e.g., gate dielectric) and polysilicon layer 130 (e.g., gate electrode) are formed, and then patterned to form gate structures. The processing continues with forming lightly doped drain (LDD) regions, forming gate spacers, forming heavy doped source/drain regions, forming self-aligned silicide features 132, forming a contact etch stop layer (CESL) 134, and forming an inter-level (or inter-layer) dielectric (ILD) layer 140. It should be noted that the region 106 may be protected during some of these processes. Accordingly, the region 106 may include the oxide layer, polysilicon layer 130, the silicide layer 132, CESL 134, and ILD layer 140. The CESL 134 may be formed of silicon nitride, silicon oxynitride, and/or other suitable materials. The ILD layer 140 may be formed of silicon oxide or a low-k dielectric material. The ILD layer 140 may be formed by chemical vapor deposition (CVD), high density plasma CVD, spin-on, PVD (or sputtering), or other suitable methods. A plurality of first contacts 142 are formed in the ILD layer 140 to provide electrical connections to the doped features (e.g., source/drain and poly gate electrode) of the transistors 110, 114 in the regions 102, 104, respectively, as well as other devices such as resistors. An ILD layer 144 is formed over the ILD layer 140 following the formation of the contacts 142. The ILD layer 144 may be formed of a similar material as the ILD layer 140.

The MIM capacitors 114 in the region 104 include a bottom electrode 150, a top electrode 152, and a high-k dielectric 154 disposed between the bottom electrode 150 and top electrode 152. The MIM capacitors 114 are formed in the ILD layer 144 such that the bottom electrode 150 is coupled to the doped feature of the transistor 112 via the contact 142.

The MIM capacitor 120 in the region 106 may be considered as two capacitors 120a, 120b connected in parallel. The capacitors 120a, 120b each includes a bottom electrode 160a, 160b, respectively, a same top electrode 162, and a high-k dielectric 164 disposed between the bottom electrodes 160a, 160b and the top electrode 162. The capacitors 120a, 120b are formed in the ILD layers 140, 144 and the bottom electrodes 160a, 160b may extend to a top surface of the polysilicon layer 130. Accordingly, the bottom electrodes 160a, 160b of the capacitors 120a, 120b, respectively, are in contact with the silicide layer 132 and the polysicon layer 130, and thus are electrically coupled to each other. As such, the total capacitance value is the sum of the capacitance values of the capacitors 120a, 120b. Further, electrical connections may be provided to interconnect the capacitor 120 with other devices in the regions 102, 104. The STI 126 isolates the capacitor 120 from the substrate noise.

Although only two capacitors 120a, 120b (two crown features) are illustrated, it is understood that the number of capacitors (multiple crown features) may vary depending on design requirements. It should also be noted that the capacitance value of the capacitors 120a, 120b are increased due to an increase of the surface area of the electrodes. The increase of the surface area can be achieved by extending the bottom electrodes 160a, 160b to the polysilicon layer 130. Further, the surface area of the capacitor 120 can be increased in this manner without adversely effecting the performance of the other regions 102, 104. For example, the surface area of the capacitors 120 may be increased by increasing the thickness of the ILD layer 144 (thereby increasing the surface are of the top and bottom electrodes) but this causes an increase of a parasitic capacitance between metal structures (interconnection structures) formed in the ILD layer 144. Moreover, the formation of the capacitors 120 is easily integrated within the process flow that forms the other devices and features of the regions 102, 104 as will be explained below in FIGS. 4-7.

The semiconductor device 100 further includes an ILD layer 168 formed over the capacitors 114, 120 in the regions 104, 106, respectively, and over the ILD layer 144 in the region 102. The semiconductor device 100 further includes a plurality of contacts 170 formed in the ILD layers 144, 168 to electrically couple the contacts 142 to a first metal layer 172 of an interconnect structure. The interconnect structure may include a plurality of metal layers for interconnecting the various devices and features in the regions 102, 104, 106 as is known in the art. It is understood that the present disclosure does not limit the specific interconnection of the logic devices to each other or to a capacitor device or to the DRAM array. Those skilled in the art will recognize that there are myriad applications, structures, device layouts and interconnection schemes in which an embodiment of a capacitor device of the present disclosure may be implemented. Accordingly, for the sake of simplicity and clarity, additional details of the logic devices, DRAM array, and the interconnection between and among the various devices are not illustrated or further described herein.

Figure 2:
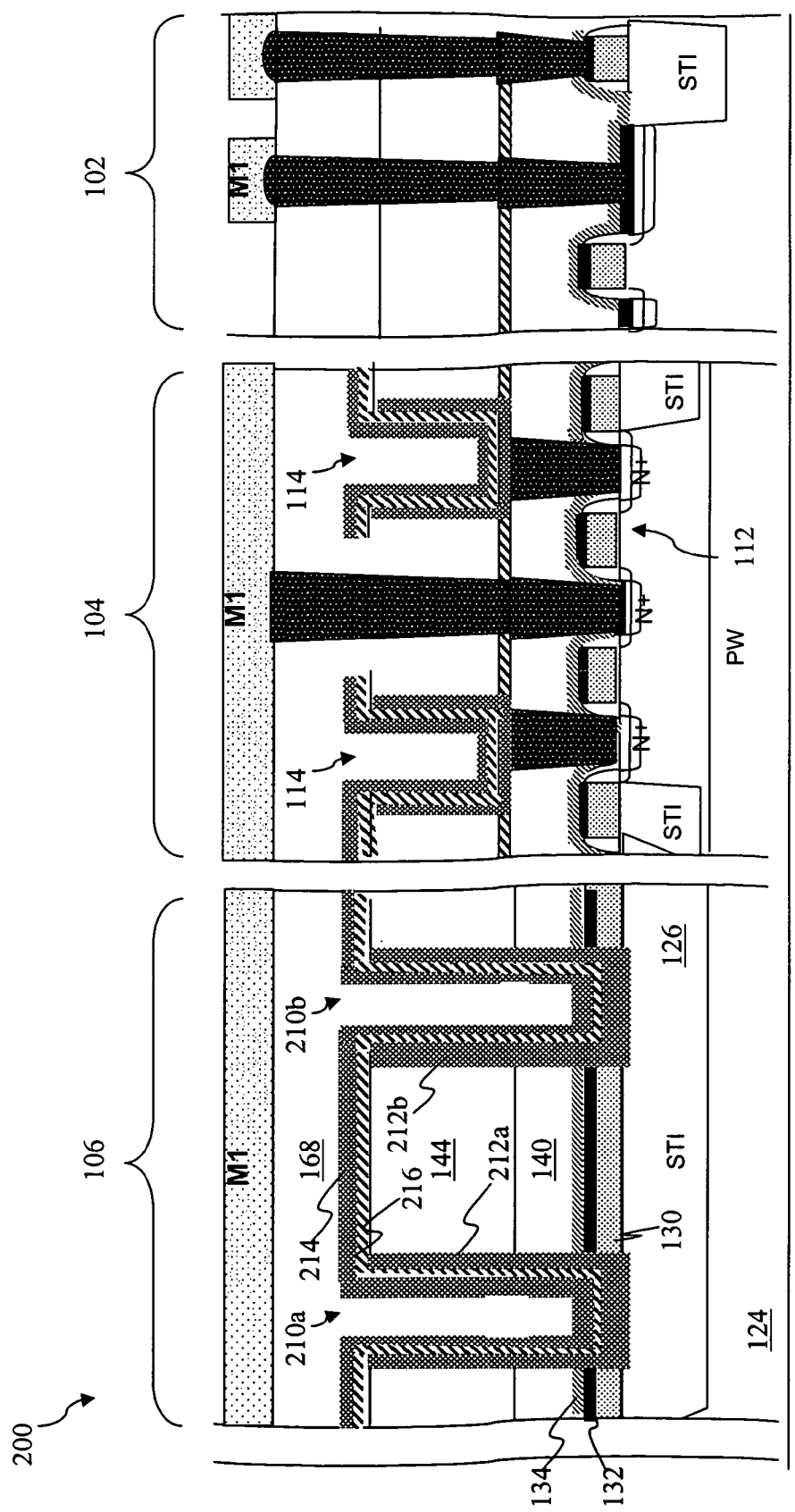
FIG. 2 illustrates a sectional view of a semiconductor device including an alternative MIM capacitor.

Referring to FIG. 2, illustrated is a sectional view of a semiconductor device 200 including an alternative embodiment of an MIM capacitor. The semiconductor device 200 is similar to the semiconductor device 100 of FIG. 1 except for the differences discussed below. Accordingly, similar features in FIGS. 1 and 2 are numbered the same for the sake of simplicity and clarity. The MIM capacitor 210 in the region 106 may be considered as two capacitors 210a, 210b as was discussed above. The MIM capacitor 210 includes bottom electrodes 212a, 212b, a top electrode 214, and a high-k dielectric 216 disposed between the bottom electrodes 212a, 212b and top electrode 214. The bottom electrodes 212a, 212b extend through the polysilicon layer 130 and to a top surface of the STI 126. Accordingly, the bottom electrodes 212a, 212b are in contact with the silicide layer 132 and polysilicon layer 130 and may be electrically coupled to each other. It should be noted that the capacitance value of the capacitor 210 is larger than the capacitor 120 in FIG. 1 due to an increase of the surface area of the capacitor 210. The increase of the surface area is achieved by extending the bottom electrodes 212a, 212b to the top surface of the STI 126. Further, the advantages discussed above with respect to the capacitor 120 in FIG. 1 are also applicable in this embodiment.

Figure 3:
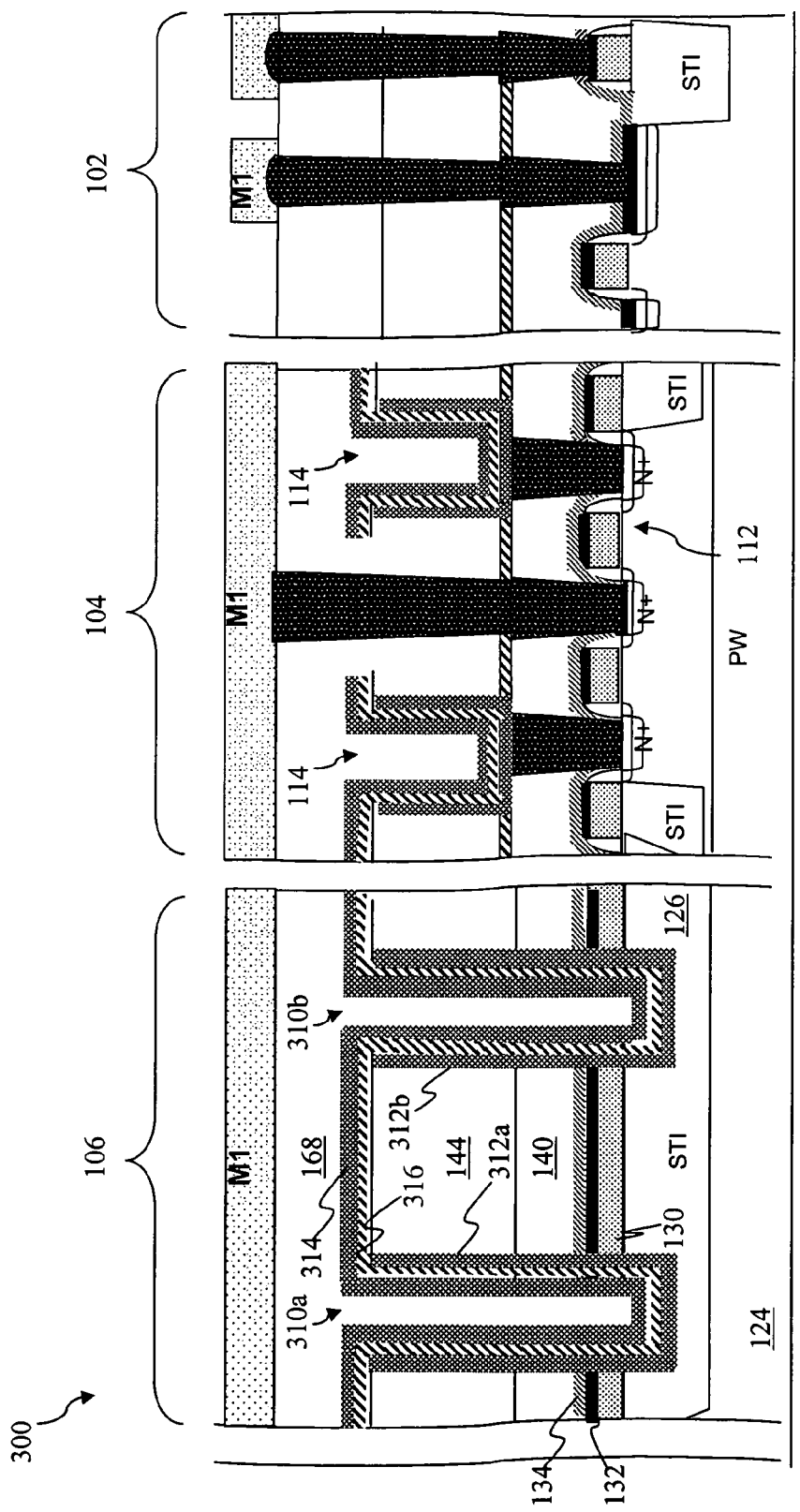
FIG. 3 illustrates a sectional view of a semiconductor device including another alternative MIM capacitor.

Referring to FIG. 3, illustrated is a sectional view of a semiconductor device 300 including another alternative embodiment of an embedded MIM capacitor. The semiconductor device 300 is similar to the semiconductor device 100 of FIG. 1 except for the differences discussed below. Accordingly, similar features in FIGS. 1 and 3 are numbered the same for the sake of simplicity and clarity. The MIM capacitor 310 in the region 106 may be considered as two capacitors 310a, 310b as was discussed above. The MIM capacitor 310 includes bottom electrodes 312a, 312b, a top electrode 314, and a high-k dielectric 316 disposed between the bottom electrodes 312a, 312b and top electrode 314. The bottom electrodes 312a, 312b extend through the polysilicon layer 130 and through a portion of the STI 126. Accordingly, the bottom electrodes 312 are in contact with the silicide layer 132 and polysilicon layer 130 and may be electrically coupled to each other. It should be noted that the capacitance value of the capacitor 310 is larger than the capacitors 120, 210 in FIGS. 1 and 2, respectively, due to an increase of the surface area of the capacitor 310. The increase of the surface area is achieved by extending the bottom electrodes 312a, 312b through a portion of the STI 126. Additionally, the amount of extension of the bottom electrodes 312a, 312b in the STI 126 may depend on design requirements and the function of the STI 126 to isolate the capacitor 310 from substrate noise. Further, the advantages discussed above with respect to the capacitors 120, 210 in FIGS. 1 and 2, respectively, are also applicable in this embodiment.

Figure 4:
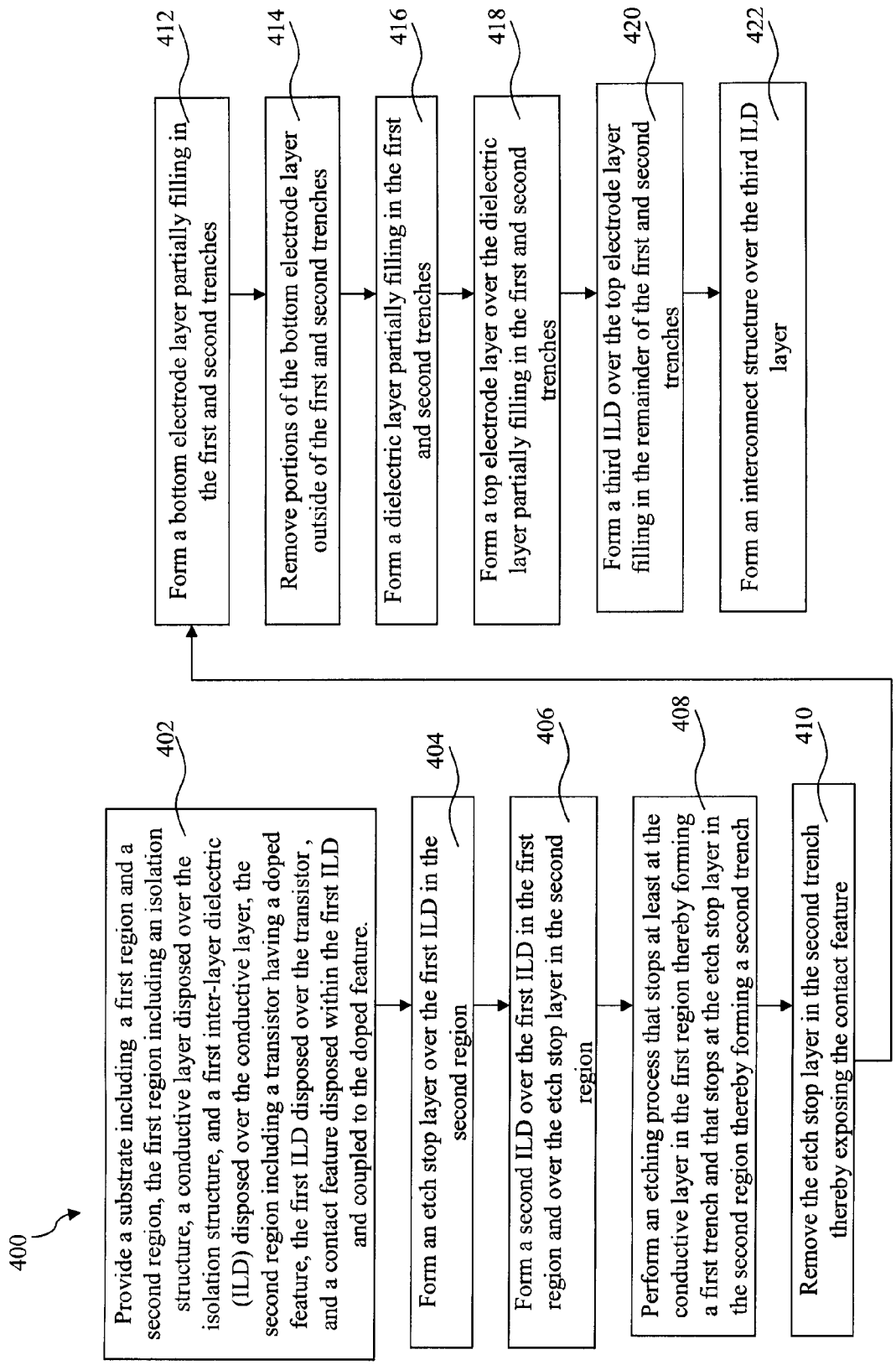
FIG. 4 illustrates a flowchart of a method for fabricating a semiconductor device including an MIM capacitor.

Referring to FIG. 4, illustrated is a flowchart of a method 400 of fabricating a semiconductor device with an embedded MIM capacitor according to various aspects of the present disclosure. Referring also to FIGS. 5A-5E, illustrated are sectional views of a semiconductor device 500 at various stages of fabrication according to the method 400 of FIG. 4. The semiconductor device 500 is similar to the semiconductor devices 100, 200, 300 in FIGS. 1-3, respectively. Accordingly, similar features in FIGS. 1-3 and 5 are numbered the same for the sake of simplicity and clarity. The method 400 begins with block 402 in which a semiconductor substrate including a first region and a second region is provided. The first region includes an isolation structure formed in the substrate, a conductive layer formed over the isolation structure, and a first inter-layer dielectric (ILD) formed over the conductive layer. The second region includes a transistor having a doped feature formed in the substrate, the first ILD formed over the transistor, and a contact feature formed in the first ILD and coupled to the doped feature of the transistor.

Figure 5A:
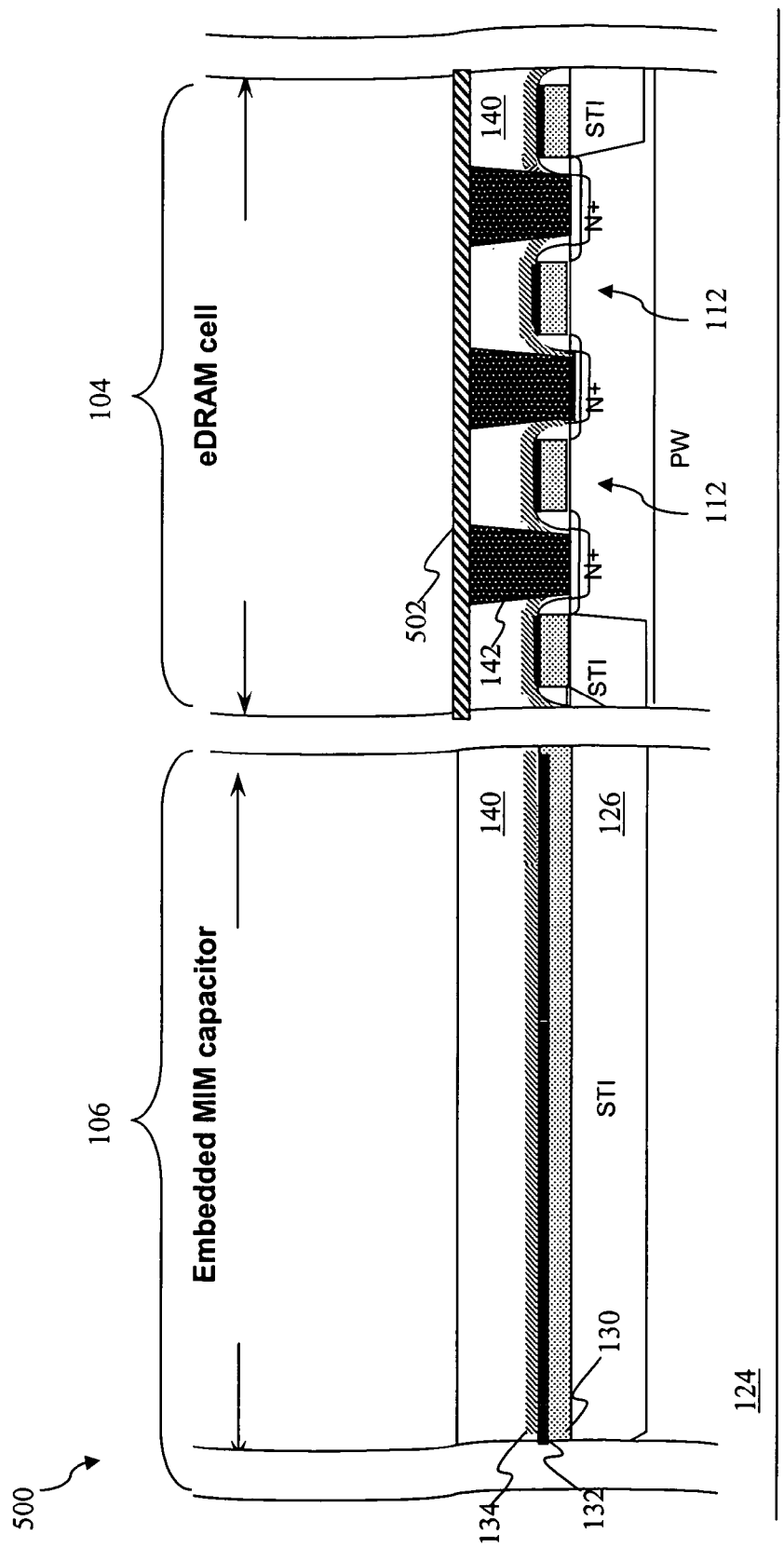
FIGS. 5A-5E illustrate sectional views of a semiconductor device at various stages of fabrication according to the method of FIG. 4.

In FIG. 5A, the semiconductor device 500 is illustrated following the formation of a plurality of first contacts 142 in the ILD layer 140 of the region 104. The first contacts 142 are coupled to the doped features of the transistors 112 in the region 104, and are coupled to the doped features (e.g., source/drain and poly gate electrode) of the transistors 120 in the region 102 (not shown). The first contacts 142 are formed by etching trenches in the ILD layer 140, filling the trenches with seed layers, barrier layers, and/or metal layers, followed by a planarizing process, such as chemical-mechanical-polishing (CMP) or a etch-back process. It should be noted that the first contacts 142 are not formed in the region 106. As previously discussed, the region 104 is configured for a DRAM or embedded DRAM array, and the region 106 is configured for a MIM capacitor. The region 106 includes an STI 126 formed in the substrate 124. The region 106 further includes an oxide layer formed on the substrate 124, a doped polysilicon layer 130 formed on the oxide layer, a silicide layer 132 formed on the polysilicon layer 130, a contact etch stop layer (CESL) 134 formed on the silicide layer 132, and the ILD layer 140 formed on the CESL 134. It is understood that the various material layers in the region 106 may be formed concurrently when forming the transistors 112 and other features in the region 104.

The method 400 continues with block 404 in which an etch stop layer is formed over the first ILD in the second region. The semiconductor device 500 includes an etch stop layer 502 formed over the ILD layer 140. A photoresist mask may be formed and patterned to protect the etch stop layer 502 in the region 104. The photoresist mask may be formed and patterned by photolithography. For example, the photolithography process includes spin coating, soft-baking, exposure, post-exposure baking, developing, rinsing, drying, and other suitable process. Accordingly, the etch stop layer in the region 106 may be removed by a wet etching process, a dry etching process, or other suitable process.

The etch stop layer 502 may function as an end point of subsequent etching processes as discussed below. Although not limited by the present disclosure, the etch stop layer 502 may comprise silicon carbide, silicon nitride, or silicon oxynitride, may be formed by CVD, plasma enhanced chemical vapor deposition (PECVD), or low pressure chemical vapor deposition (LPCVD). The etch stop layer may have a thickness ranging from about 500 to about 1500 angstrom (A). For example, in an embodiment in which the etch stop layer 502 comprises silicon carbide, the etch stop layer 502 may be formed by PECVD employing a process chemistry comprising trimethylsilane.

Figure 5B:
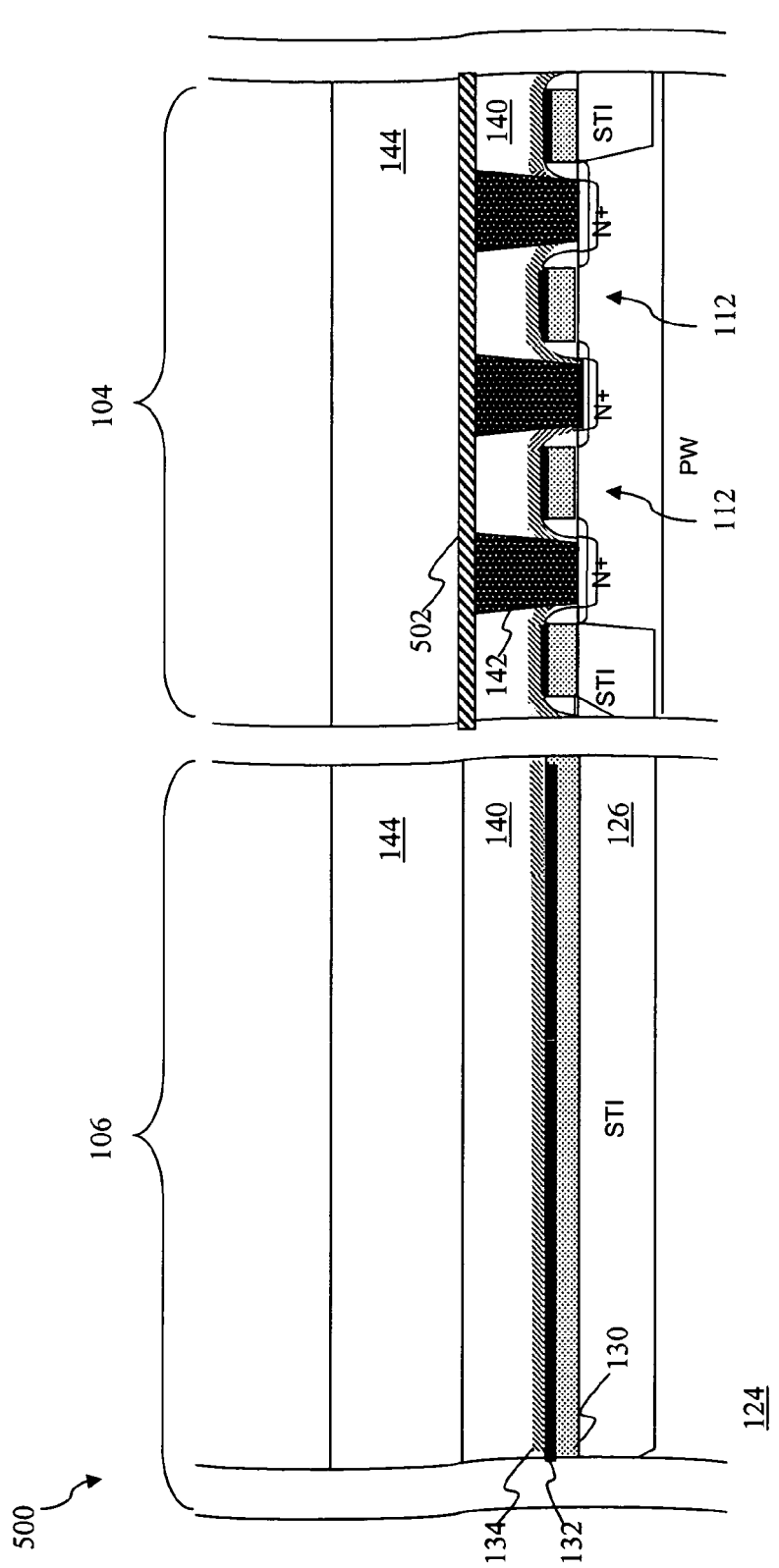

The method 400 continues with block 406 in which a second ILD is formed over the first ILD in the first region and over the etch stop layer in the second region. In FIG. 5B, the semiconductor device 500 further includes an ILD layer 144 formed over the ILD layer 140 in the region 106 and over the etch stop layer 502 in the region 104. The ILD layer 144 may be formed of a similar material as the ILD layer 140. The ILD layer 144 may be formed of silicon oxide or a low-k dielectric material. The ILD layer 144 may be formed by chemical vapor deposition (CVD), high density plasma CVD, spin-on, PVD (or sputtering), or other suitable methods. The ILD layer 144 may have a thickness ranging from about 5000 to about 12000 angstrom (A).

Figure 5C:
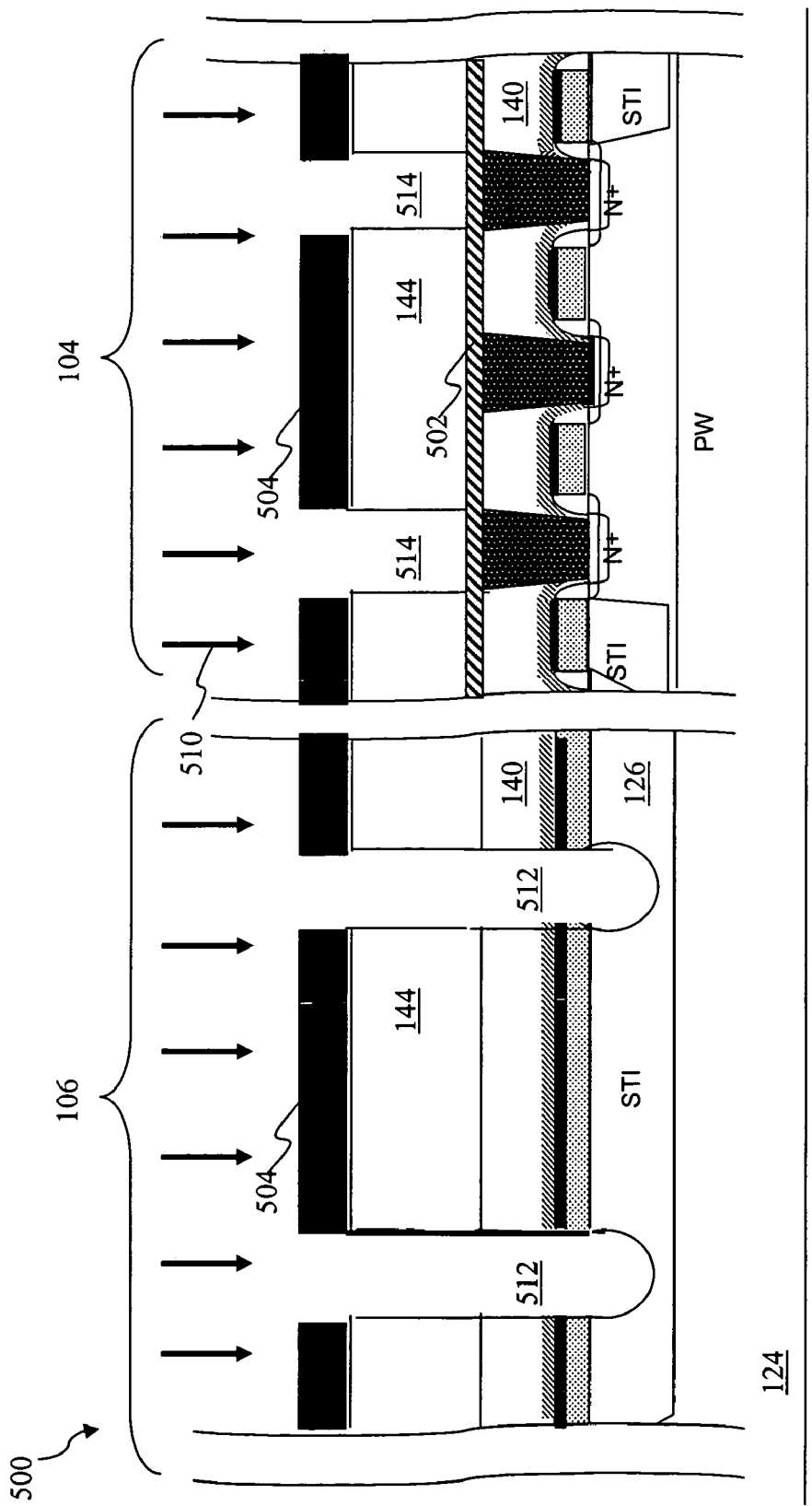
Figure 8:
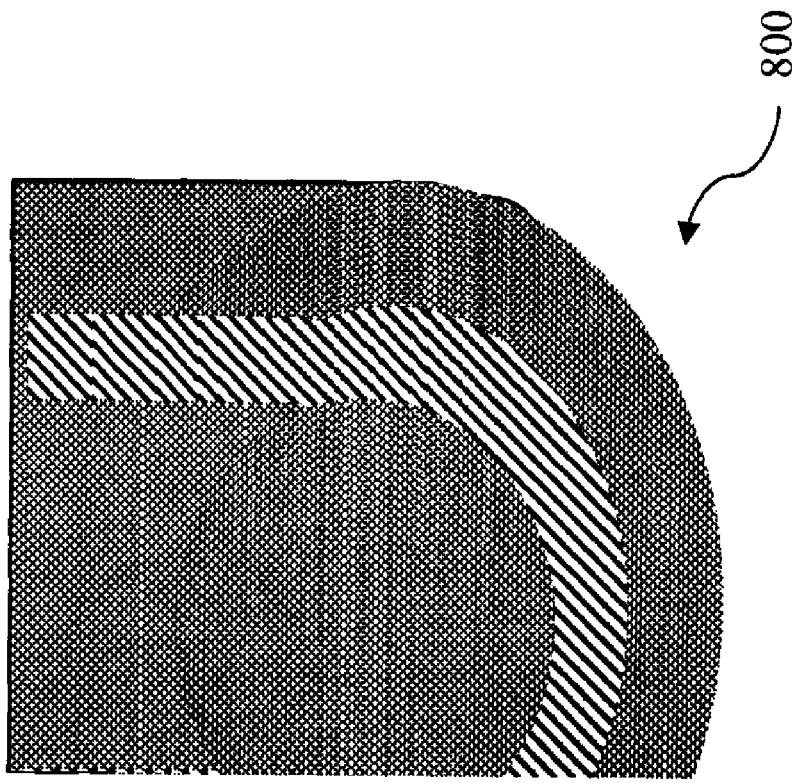
FIG. 8 illustrates a rounded corner profile of a MIM capacitor according to various aspects of the present disclosure.

The method 400 continues with block 408 in which an etching process is performed that stops at least at the conductive layer in the first region thereby forming a first trench and that stops at the etch stop layer in the second region thereby forming a second trench. In FIG. 5C, a photoresist 504 is formed to define openings for the capacitors in the regions 104 and 106. The photoresist 504 may be employed as a mask during an etching process 510 and subsequently stripped, such as by wet stripping or plasma ashing. The etching process 510 may include a dry etch, a wet etch, a reactive ion etch (RIE), or combination dry and wet etch process. In the present embodiment, the etching process 510 includes a dry etch that passes through the silicide layer 132, polysilicon layer 130, and a portion of the STI 126 in the region 106, and that stops at the etch stop layer 502 in the region 104. It should be noted the dry etch may stop at a top surface of the polysilicon layer 130 in some embodiments (similar to FIG. 1), or may stop at a top surface of the STI 126 in some other embodiments (similar to FIG. 2). As such, trenches 512 are formed in the region 106 and trenches 514 are formed in the region 104. The trenches 512 may have vertical sidewalls and substantially square corners due to the anisotropic dry etch process. Accordingly, the etching process 510 further includes an isotropic etch process that modifies a corner profile of the trenches 512 in the region 106. In some embodiments, the corner profile of the trenches 512 are rounded and smoothed by an isotropic wet etch process (e.g., wet dip) as illustrated by 800 of FIG. 8. It has been observed that the capacitance value can be increased and the reliability of the MIM structure (e.g., time dependent dielectric breakdown (TDDB)) can be improved due to corner rounding and smoothing.

Figure 5D:
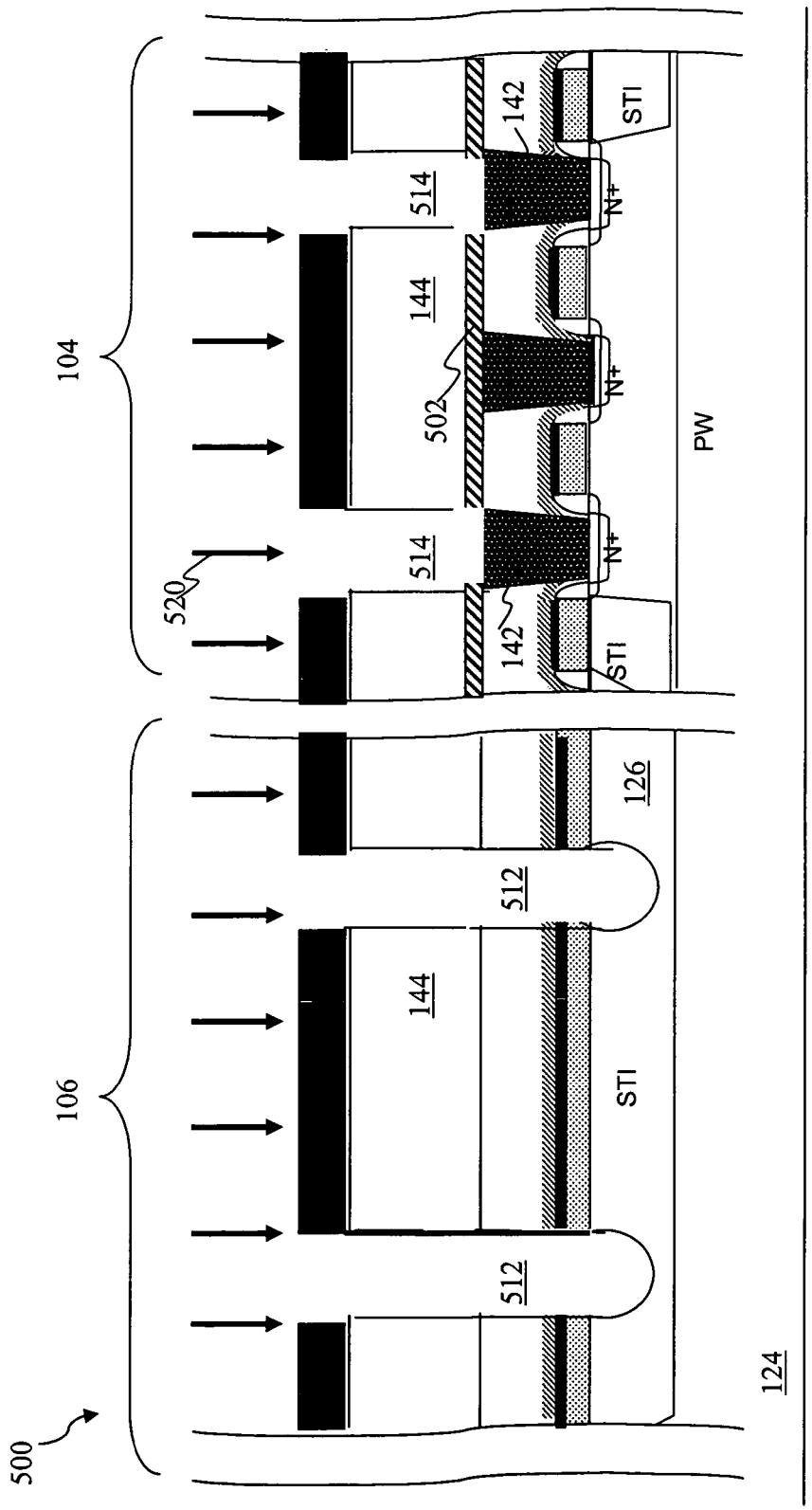

The method 400 continues with block 410 in which the etch stop layer in the second trench is removed thereby exposing the contact feature. In FIG. 5D, an etching process 520 is performed to selectively remove portions of the etch stop layer 502 that are exposed in the trenches 514 in the region 106. The etching process 520 may include a dry etch, dry etch, or combination wet and dry etch process. For example, the etching process 520 includes a dry etch process that has a high etching selectivity of silicon carbide to remove the exposed etch stop layer 502. Accordingly, the first contacts 142 are exposed in the trenches 514.

Figure 5E:
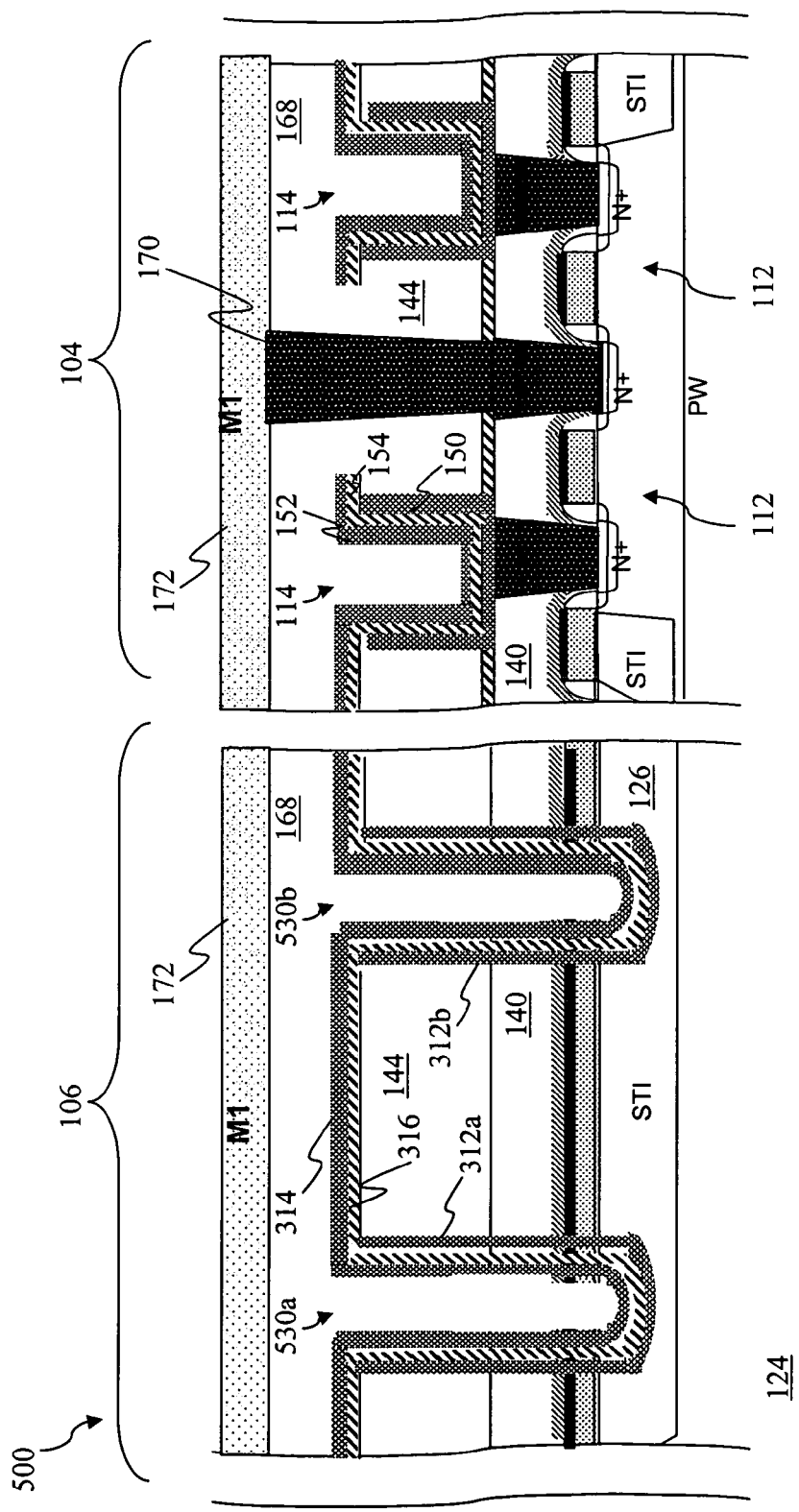

The method 400 continues with block 412 in which a bottom electrode layer is formed to partially fill in the first and second trenches. In FIG. 5E, a metal layer is formed over the ILD layer 144 to partially fill in the trenches 512, 514. The metal layer may function as a bottom electrode layer for the capacitors in the regions 104 and 106. The metal layer includes titanium nitride (TiN). Although not limited by the present disclosure, the metal layer may have a thickness ranging from about 100 to about 500 angstrom (A). The metal layer may be formed by atomic layer deposition (ALD), PVD, CVD, or other suitable technique. Alternatively, the metal layer may optionally include may tantalum nitride (TaN), tungsten nitride (WN), ruthenium (Ru), iridium (Ir), platinum (Pt), and combinations thereof. In other embodiments, the metal layer may include a stack of two or more layers, such as a titanium nitride/titanium or titanium nitride/tungsten.

The method 400 continues with block 414 in which portions of the bottom electrode layer outside the first and second trenches are removed. The semiconductor device 500 is planarized to remove portions of the metal layer outside of the trenches 512, 514. For example, a CMP or etch back process may be performed on the metal layer and substantially stops at the ILD layer 144. Accordingly, a bottom electrode 150 of a capacitor 114 is formed in the trenches 514 of the region 104, and bottom electrodes 312a, 312b of capacitor 530a, 530b are formed in the trenches 512 of the region 106. The bottom electrode 150 of the capacitor 114 is electrically coupled to the doped feature of the transistor 112 via the first contact 142 in the region 104. As previously discussed, the capacitor 530 in the region 106 may be considered as two capacitors 530a, 530b connected in parallel. Accordingly, the bottom electrodes 312a, 312b are electrically coupled to the silicide layer 132 and polysilicon layer 130 in the region 106, and thus are electrically coupled to each other.

The method 400 continues with block 416 in which a dielectric layer is formed to partially fill in the first and second trenches. A dielectric layer 154, 316 is formed in the regions 104, 106, respectively, partially filling in the trenches 514, 512. Although, referenced as different numbers 154, 316, it is understood that the dielectric layer 154, 316 illustrated in the regions 104, 106 are formed of the same material and process. The dielectric layer 154, 316 includes a high-k dielectric material such as zirconium oxide ($ZrO_2$). Alternatively, the dielectric layer 154, 316 may optionally include one or more layers of silicon oxide ($SiO_2$), silicon nitride ($Si_3N_4$), silicon oxynitride (SiON), aluminum oxide ($Al_2O_3$), hafnium silicates (HfSiON), tantalum oxide ($Ta_2O_5$), hafnium oxide ($HfO_2$), titanium oxide ($TiO_2$), barium strontium titanate (BST), strontium titanate oxide (STO), or combinations thereof. The dielectric layer 154, 316 may have a thickness ranging between about 50 to about 400 angstrom (A). The dielectric layer 154, 316 may be formed by ALD, CVD, PVD, or other suitable technique.

The method 400 continues with block 418 in which a top electrode layer is formed over the dielectric layer to partially fill in the first and second trenches. Another metal layer may be formed over the dielectric layer 154, 316 that partially fills in the trenches 512, 514. The metal layer functions as a top electrode layer 152, 314 for the capacitors 114, 530, respectively. The metal layer includes titanium nitride (TiN). Although not limited by the present disclosure, the metal layer may have a thickness ranging from about 100 to about 500 angstrom (A). The metal layer may be formed by atomic layer deposition (ALD), PVD, CVD, or other suitable technique. Alternatively, the metal layer may optionally include may tantalum nitride (TaN), tungsten nitride (WN), ruthenium (Ru), iridium (Ir), platinum (Pt), and combinations thereof. In other embodiments, the metal layer may include a stack of two or more layers, such as a titanium nitride/titanium or titanium nitride/tungsten.

The method 400 continues with block 420 in which a third ILD is formed over the top electrode layer and filling in the remainder of the first and second trenches. The semiconductor device 500 further includes an ILD layer 168 formed over the capacitors 114, 530 substantially filling in the remainder of the trenches 512, 514. The ILD layer 168 may be similar to the ILD layer 144. The method 400 continues with block 4222 in which an interconnect structure is formed over the third ILD. The semiconductor device 500 includes an interconnect structure formed over the ILD layer 168 for interconnecting the various devices in the regions 102 (not shown), 104, 106 to form an integrated circuit or system-on-chip (SoC) device. The interconnect structure includes a plurality of metal layers (a first level metal layer 172 is illustrated) and intermetal dielectric for insulating each of the metal layers. Further, the interconnect structure includes vertical connections (vias/contacts) and horizontal connections (lines). It should be noted that etch stop layer 502 in the region 104 may be an extra loading for the etching process that forms the second level contacts. For example, a plurality of contacts 170 may be formed in the ILD layers 144, 168 for coupling the contacts 142 to the first metal layer 172.

Figure 6:
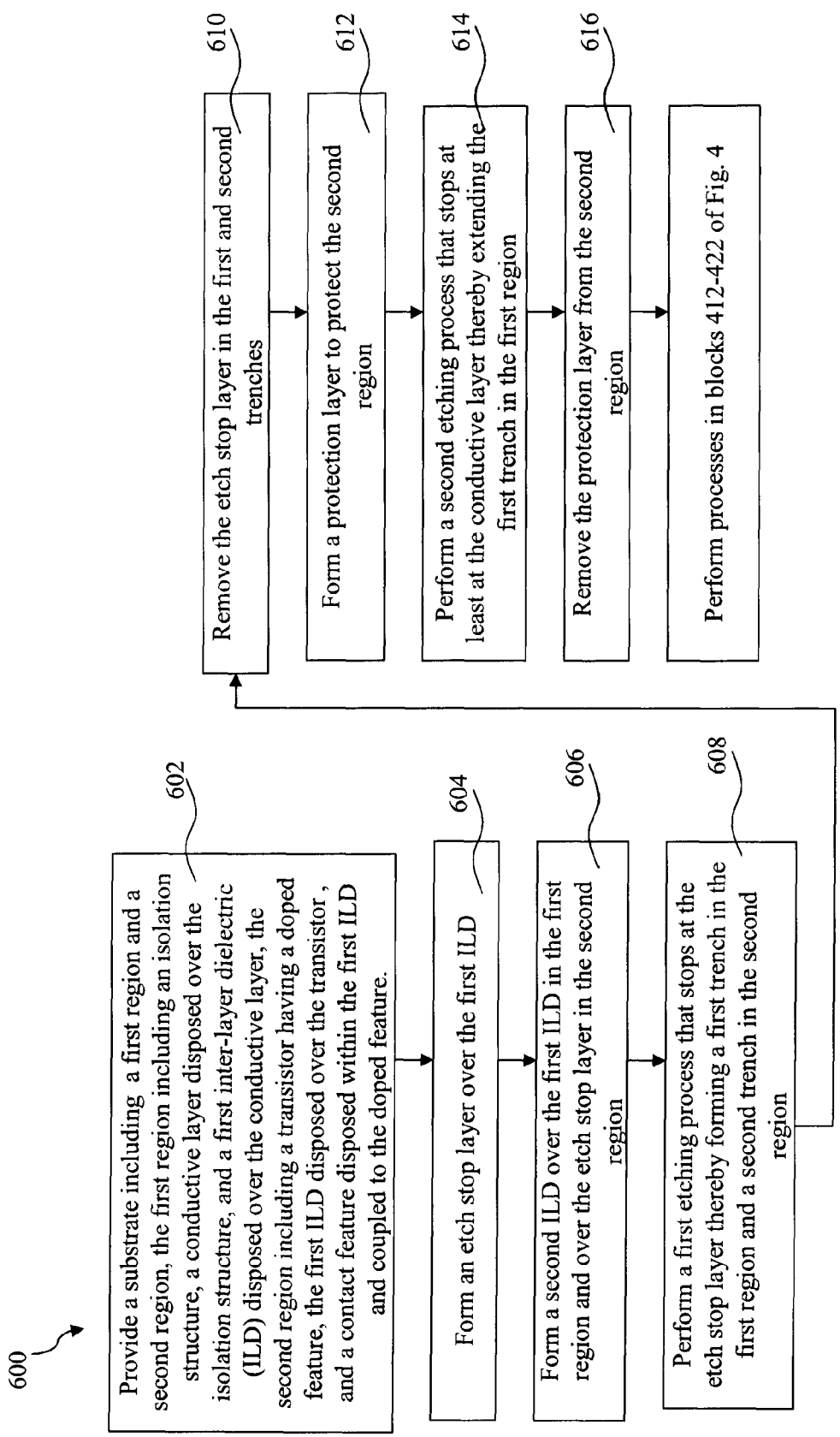
FIG. 6 illustrates a flowchart of an alternative method for fabricating a semiconductor device including an MIM capacitor.

Referring to FIG. 6, illustrated is a flowchart of an alternative method 600 of fabricating a semiconductor device with a MIM capacitor according to various aspects of the present disclosure. The method 600 implements some of the same processes as the method 400 of FIG. 4. Referring also to FIGS. 7A-7G, illustrated are sectional views of a semiconductor device 700 at various stages of fabrication according to the method of FIG. 4. The semiconductor device 700 is similar to the semiconductor devices 100, 200, 300 in FIGS. 1-3, respectively. Accordingly, similar features in FIGS. 1-3 and 7 are numbered the same for the sake of simplicity and clarity. The method 600 begins with block 602 (similar to block 402 of FIG. 4) in which a semiconductor substrate including a first region and a second region is provided. The first region includes an isolation structure formed in the substrate, a conductive layer formed over the isolation structure, and a first inter-layer dielectric (ILD) formed over the conductive layer. The second region includes a transistor having a doped feature formed in the substrate, the first ILD formed over the transistor, and a contact feature formed in the first ILD and coupled to the doped feature of the transistor.

Figure 7A:
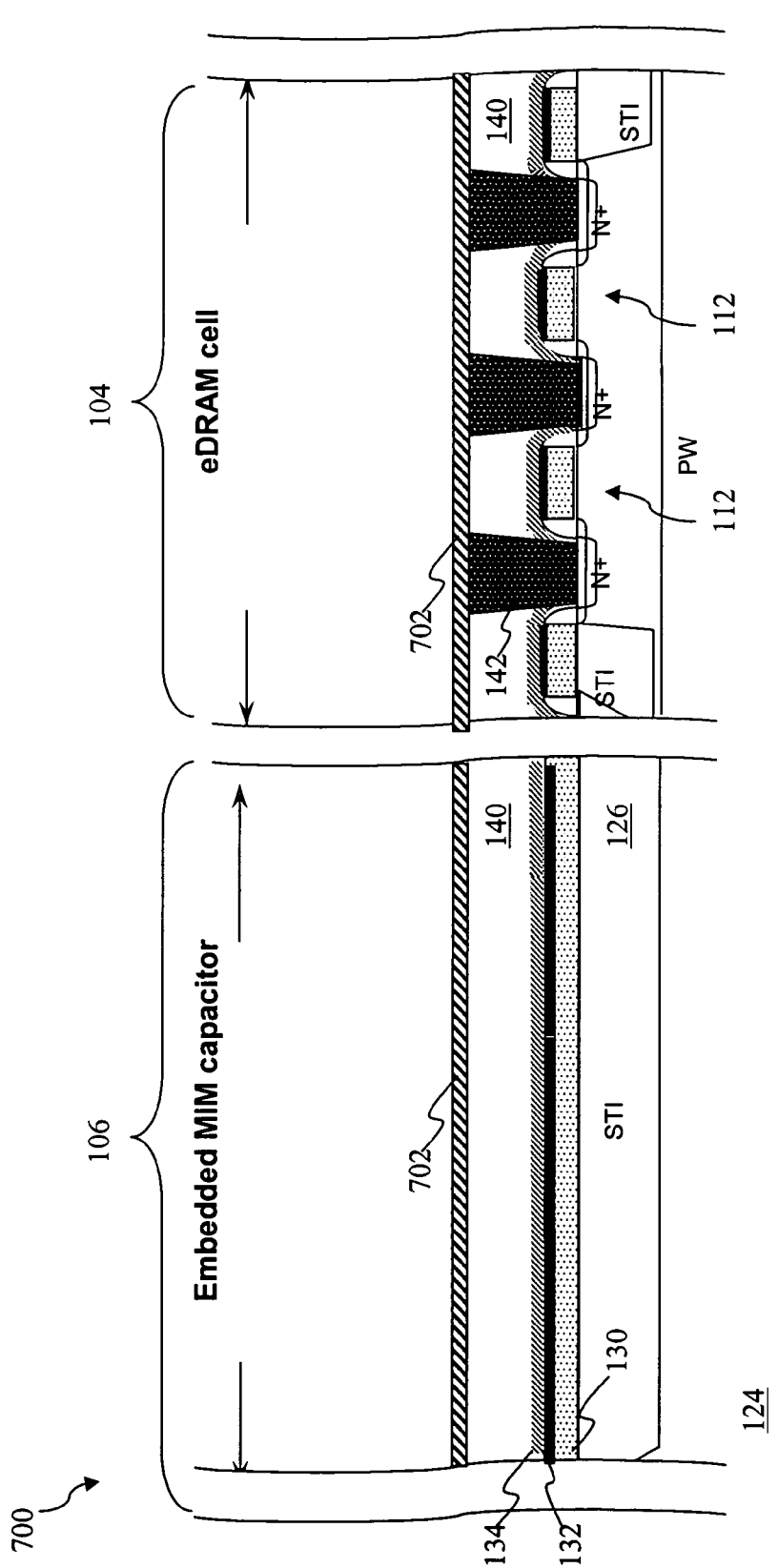
FIGS. 7A-7G illustrate sectional views of a semiconductor device at various stages of fabrication according to the method of FIG. 6.

In FIG. 7A, the semiconductor device 700 is illustrated following the formation of a plurality of first contacts 142 in the ILD layer 140 of the region 104. The first contacts 142 are coupled to the doped features of the transistors 112 in the region 104, and are coupled to the doped features (e.g., source/drain and poly gate electrode) of the transistors 120 in the region 102 (not shown). The first contacts 142 are formed by etching trenches in the ILD layer 140, filling the trenches with seed layers, barrier layers, and/or metal layers, followed by a planarizing process, such as chemical-mechanical-polishing (CMP) or a etch-back process. It should be noted that the first contacts 142 are not formed in the region 106. As previously discussed, the region 104 is configured for a DRAM or embedded DRAM array, and the region 106 is configured for a MIM capacitor. The region 106 include an STI 126 formed in the substrate 124. The region 106 further includes an oxide layer formed on the substrate 124, a doped polysilicon layer 130 formed on the oxide layer, a silicide layer 132 formed on the polysilicon layer 130, a contact etch stop layer (CESL) 134 formed on the silicide layer 132, and the ILD layer 140 formed on the CESL 134. It is understood that the various material layers in the region 106 may be formed concurrently when forming the transistors 112 and other features in the region 104.

The method 600 continues with block 604 in which an etch stop layer is formed over the first ILD. The semiconductor device 700 includes an etch stop layer 702 formed over the ILD layer 140. The etch stop layer 702 may function as an end point of subsequent etching processes as discussed below. Although not limited by the present disclosure, the etch stop layer 702 may comprise silicon carbide, silicon nitride, or silicon oxynitride, may be formed by CVD, plasma enhanced chemical vapor deposition (PECVD), or low pressure chemical vapor deposition (LPCVD). The etch stop layer may have a thickness ranging from about 500 to about 1500 angstrom (A). For example, in an embodiment in which the etch stop layer 702 comprises silicon carbide, the etch stop layer 702 may be formed by PECVD employing a process chemistry comprising trimethylsilane.

Figure 7B:
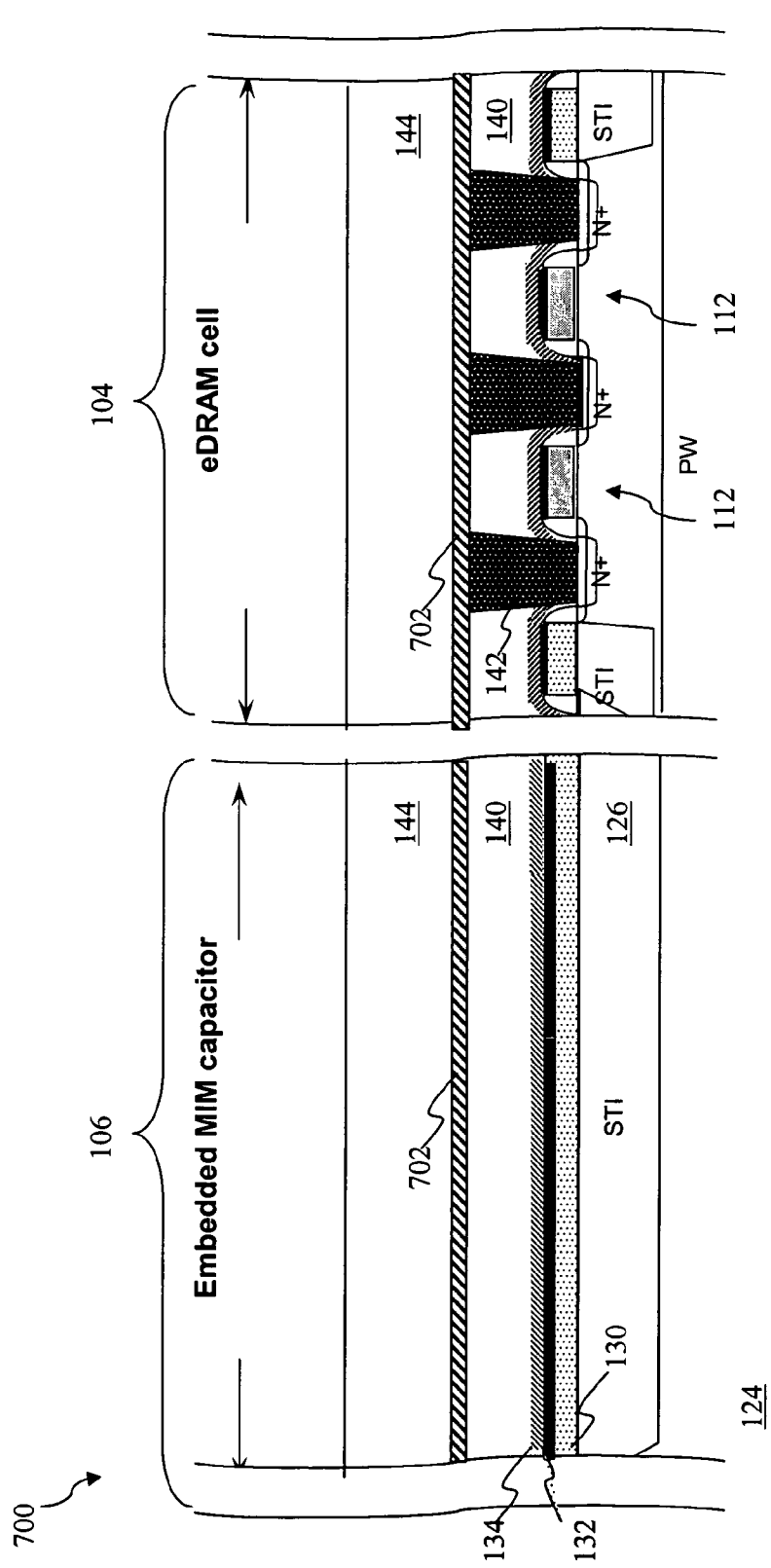

The method 600 continues with block 606 in which a second ILD is formed over the etch stop layer. In FIG. 7B, the semiconductor device 700 further includes an ILD layer 144 formed over the etch stop layer 702. The ILD layer 144 may be formed of a similar material as the ILD layer 140. The ILD layer 144 may be formed of silicon oxide or a low-k dielectric material. The ILD layer 144 may be formed by chemical vapor deposition (CVD), high density plasma CVD, spin-on, PVD (or sputtering), or other suitable methods. The ILD layer 144 may have a thickness ranging from about 5000 to about 12000 angstrom (A).

Figure 7C:
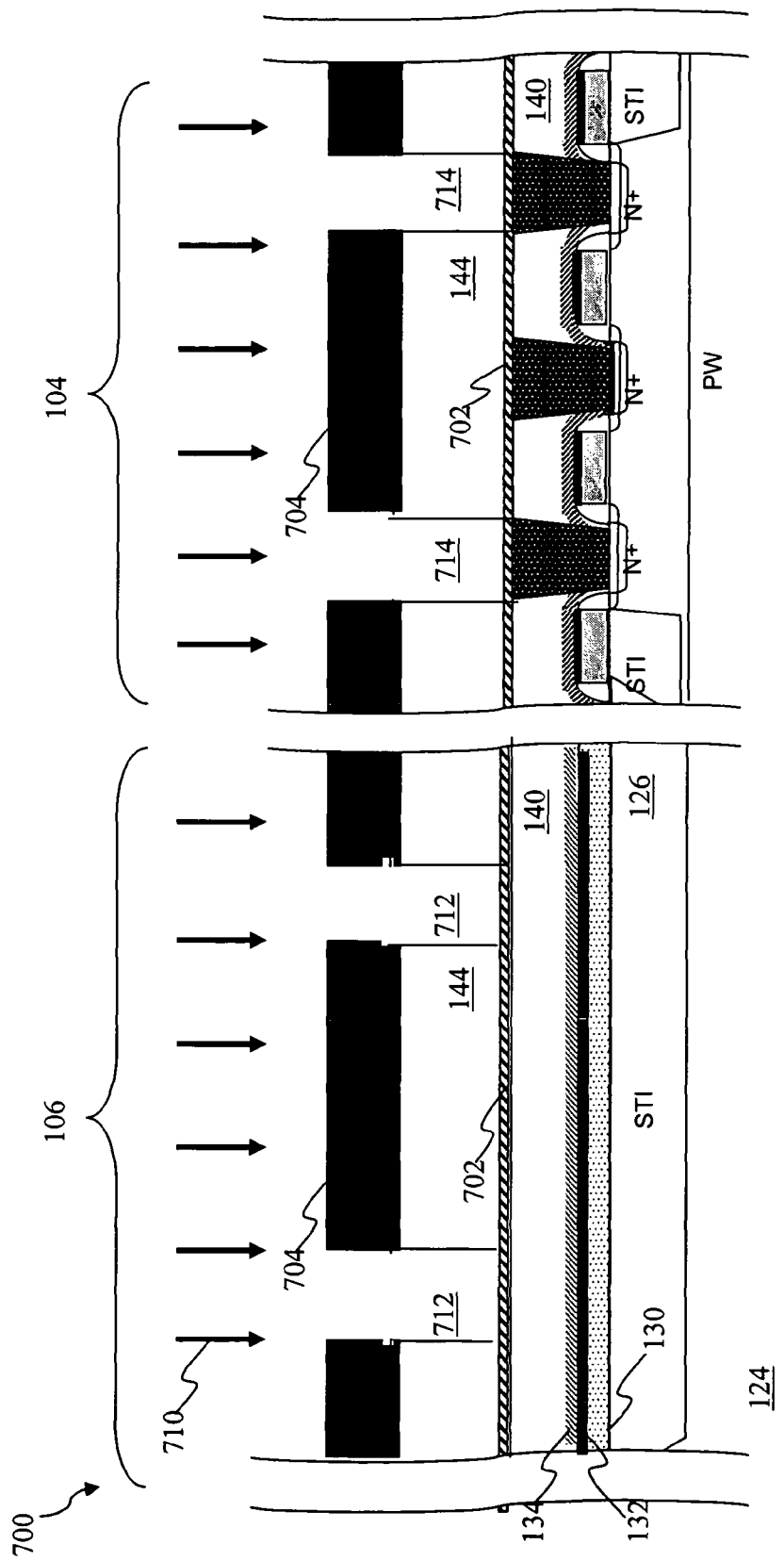

The method 600 continues with block 608 in which a first etching process is performed that stops at the etch stop layer thereby forming a first trench in the first region and a second trench in the second region. In FIG. 7C, a photoresist 704 is formed to define openings for the capacitors in the regions 104 and 106. The photoresist 704 may be employed as a mask during an etching process 710 and subsequently stripped, such as by wet stripping or plasma ashing. The etching process 710 may include a dry etch, a wet etch, a reactive ion etch (RIE), or combination dry and wet etch process. In the present embodiment, the etching process 710 may include a dry etch that passes through the ILD layer 144 and substantially stops at the etch stop layer 702. Accordingly, trenches 712 may be formed in the region 106 and trenches 714 may be formed in the region 104.

Figure 7D:
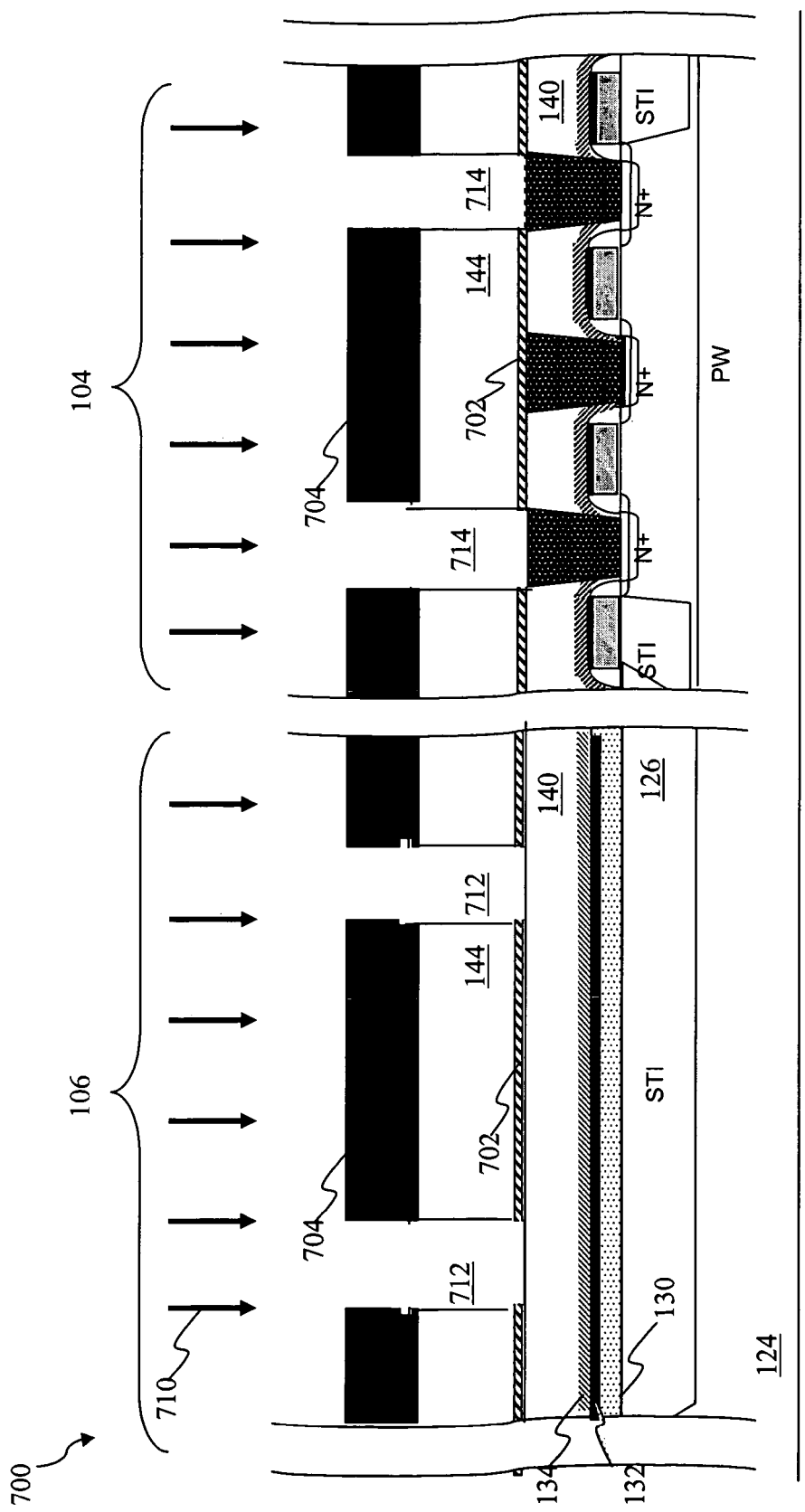

The method 600 continues with block 610 in which the etch stop layer in the first and second trenches are removed. In FIG. 7D, an etching process 720 is performed to selectively remove portions of the etch stop layer 702 that are exposed in the trenches 712, 714 in the regions 106, 104, respectively. The etching process 720 may include a dry etch, dry etch, or combination wet and dry etch process. For example, the etching process 720 includes a dry etch process that has a high etching selectivity of silicon carbide to remove the exposed etch stop layer 702. Accordingly, the first contacts 142 may be exposed in the trenches 714.

Figure 7E:
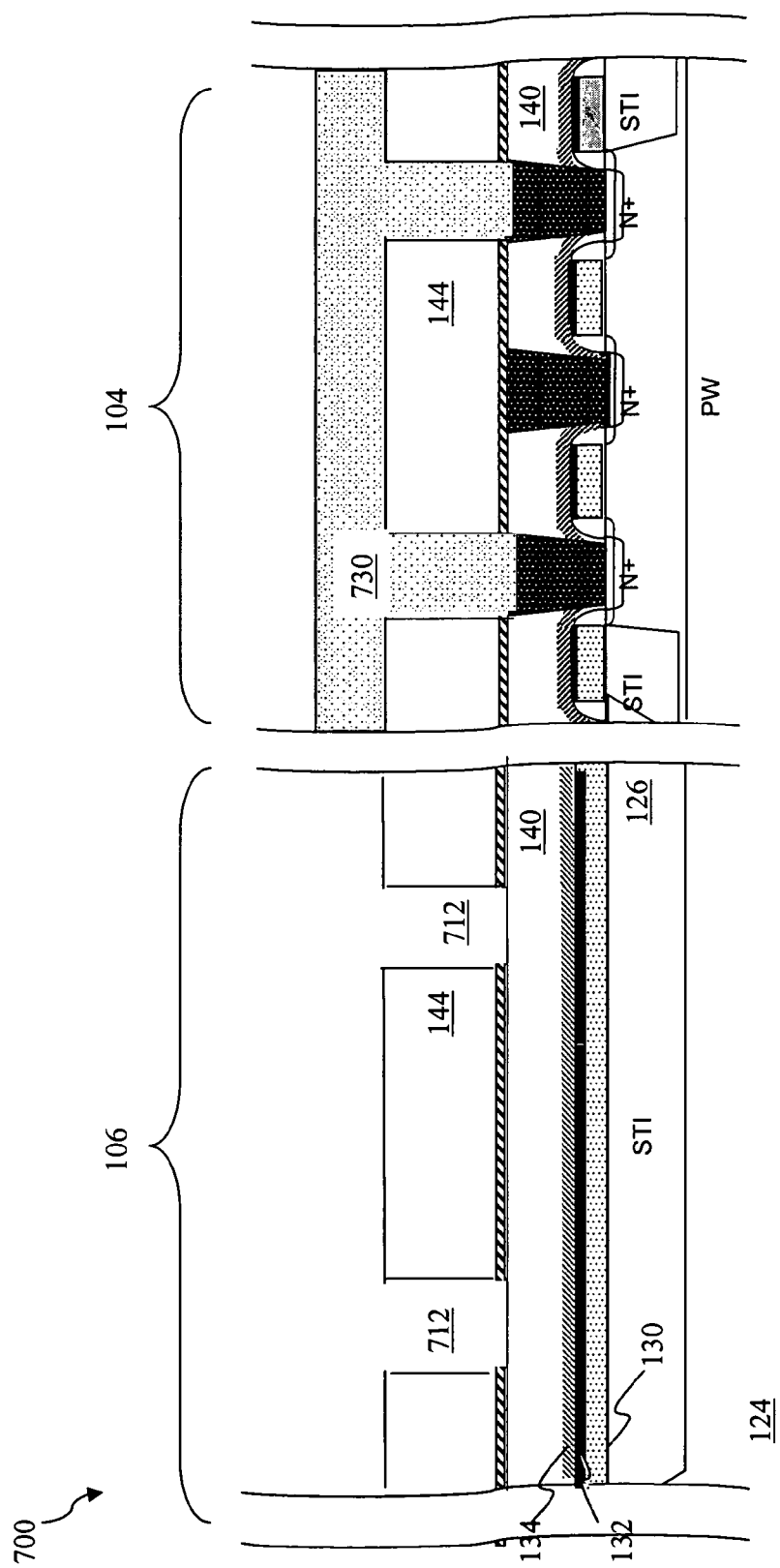

The method 600 continues with block 612 in which a protection layer is formed to protect the second region. In FIG. 7E, a protection layer, such as a photoresist mask 730, is formed to the protect the region 104 and fills in the trenches 714. The photoresist mask 730 may be formed by a photolithography process as was discussed above.

Figure 7F:
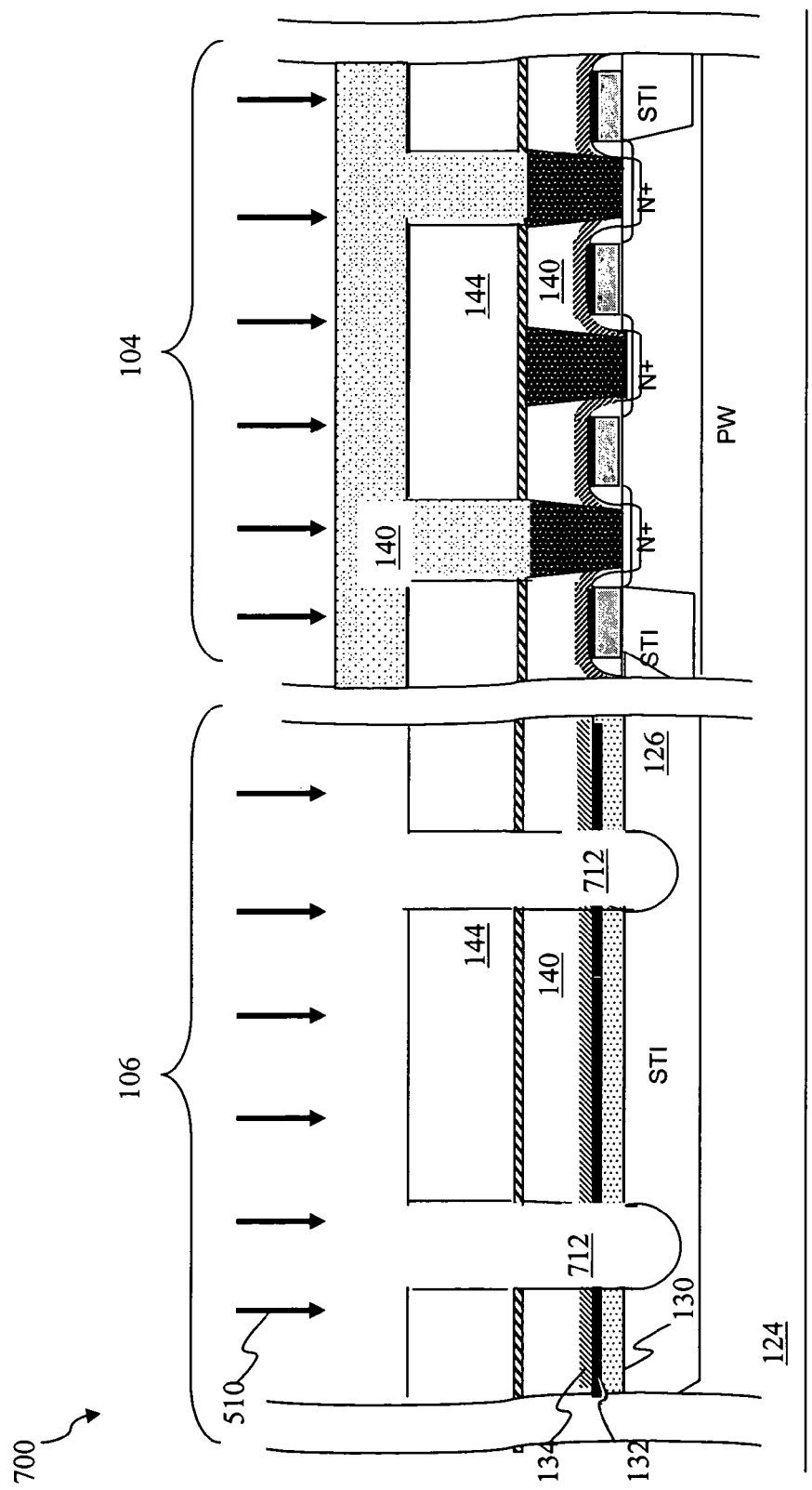

The method 600 continues with block 614 in which a second etching process is performed that stops at least at the conductive layer in the first region thereby extending the first trench. In FIG. 7F, an etching process 740 is performed to extend the trenches 712 through the silicide layer 132, polysilicon layer 130, and a portion of the STI 126. The etching process may 740 include a dry etch, a wet etch, a reactive ion etch (RIE), or combination dry and wet etch process. In the present embodiment, the etching process 740 includes a dry etch process that extends the trenches 712 into the STI 126. It should be noted the dry etch may stop at a top surface of the polysilicon layer 130 in some embodiments (similar to FIG. 1), or may stop at a top surface of the STI 126 in some other embodiments (similar to FIG. 2). The trenches 712 have vertical sidewalls and substantially square corners due to the anisotropic dry etch process. Accordingly, the etching process 740 further includes an isotropic etch process that modifies a corner profile of the trenches 712 in the region 106. In some embodiments, the corner profile of the trenches 712 may be rounded and smoothed by an isotropic wet etch process (e.g., wet dip) as illustrated by 800 of FIG. 8. It has been observed that the capacitance value can be increased and the reliability of the MIM structure (e.g., time dependent dielectric breakdown (TDDB)) can be improved due to corner rounding and smoothing.

Figure 7G:
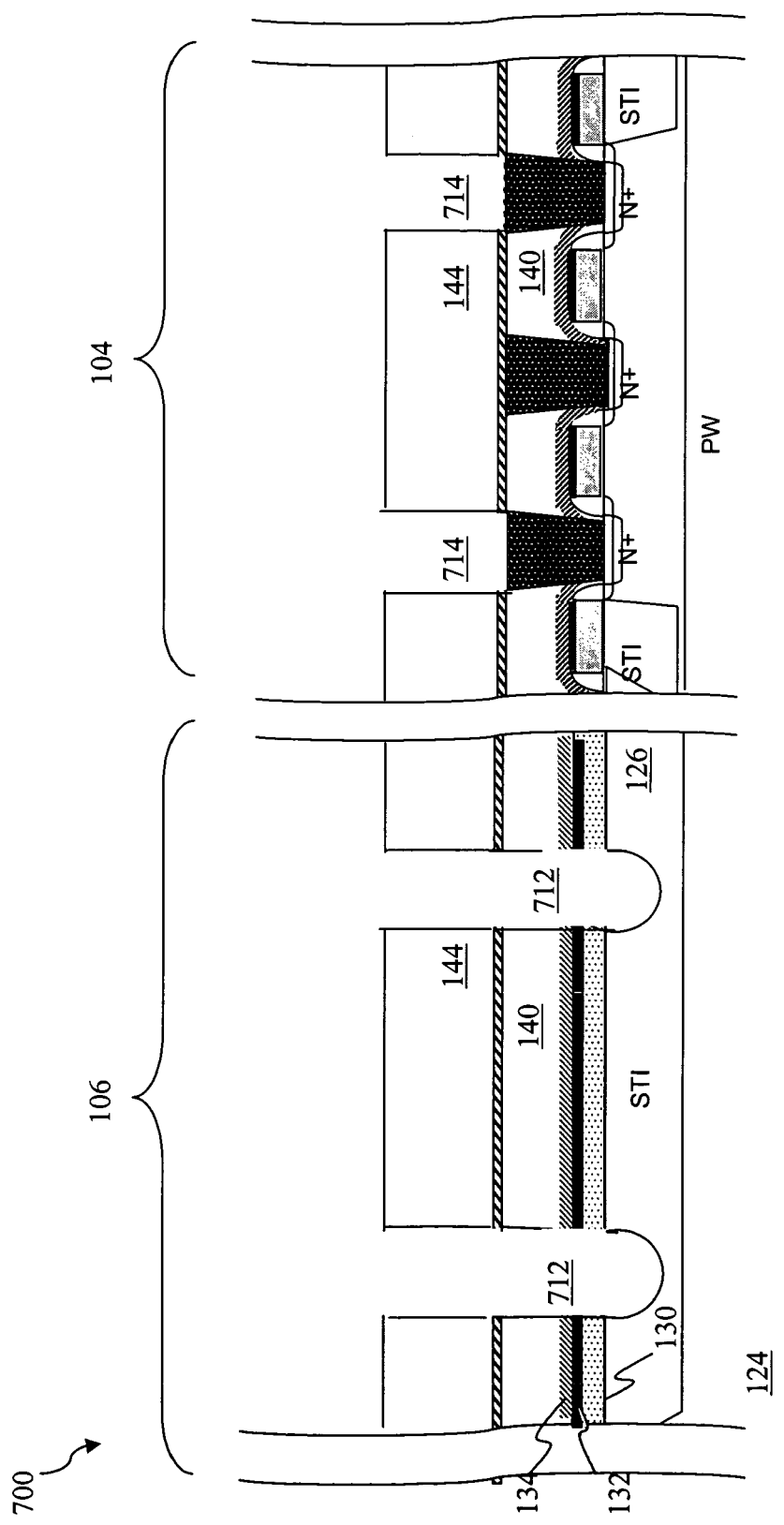

The method 600 continues with block 616 in which the protection layer is removed. In FIG. 7G, the photoresist mask 730 is removed from the region 106 by wet stripping or plasma ashing after the etching process 740. The method 600 continues with blocks 412-422 of FIG. 4 to complete fabrication of the capacitors in the trenches 712, 714, and the interconnection structure for interconnecting the various devices and features of the regions 102 (not shown), 104, and 106.

In summary, the methods and devices disclosed herein provide a compact MIM capacitor design with increased capacitance which may be implemented to reduce the chip size. Accordingly, the capacitor design may be implemented in current and advance technology node processes (e.g., 90 nm, 65 nm, 40 nm, and beyond). The MIM capacitor designs disclosed herein may provide various functions and may be integrated in various applications to provide a system on chip (SoC) device. The methods and devices disclosed herein increase the surface area of the capacitor (e.g., capacitor density) by extending the crown-shaped structure at least to a conductive layer formed over an isolation structure.

In some embodiments, the MIM structure may be extended through the conductive layer and to a top surface of the isolation structure. In some other embodiments, the MIM structure may be extended through the conductive layer and a portion of an isolation structure. Further, multiple crown structures may be coupled to each other using the conductive layer formed over the isolation structure. Accordingly, the capacitance values may be increased without adversely effecting the performance (e.g., increased parasitic capacitance) in other regions of the semiconductor device. Moreover, aspects of the present disclosure may be readily implemented into existing device fabrication with little or no complexity, and with little impact to fabrication time and costs.

The present invention has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. For example, although the methods and devices disclosed herein utilize a polysilicon layer and silicide layer to couple the bottom electrodes of the MIM capacitor, it is contemplated other types of conductive layers may be used. For high-k metal gate technology, the conductive layer may include a metal layer that is used to form the metal gate of the transistors in the other regions of the semiconductor device. Accordingly, it is appropriate that the appended claims be construed broadly and in a manner consistent with the scope of the invention.

What is claimed is:

1. A semiconductor device, comprising:
a semiconductor substrate;
an isolation structure disposed in the semiconductor substrate;
a conductive layer disposed over the isolation structure; and
a metal-insulator-metal (MIM) capacitor disposed over the isolation structure, the MIM capacitor having a crown shape that includes a top electrode, a first bottom electrode, and a dielectric disposed between the top electrode and the first bottom electrode, the first bottom electrode extending completely through the conductive layer and physically contacting a portion of the isolation structure.

2. The semiconductor device of claim 1, wherein the dielectric layer includes a high-k dielectric layer.

3. The semiconductor device of claim 1, further comprising a silicide layer disposed on the conductive layer;
wherein the conductive layer includes a doped polysilicon layer; and
wherein the first bottom electrode extends through the silicide layer and is electrically coupled to the silicide layer.

4. The semiconductor device of claim 1, wherein the MIM capacitor further includes a second bottom electrode that extends at least to the top surface of the conductive layer;
wherein the dielectric layer is disposed between the top electrode and the second bottom electrode; and
wherein the first bottom electrode is electrically coupled to the second bottom electrode via the conductive layer.

5. The semiconductor device of claim 1, wherein the first bottom electrode includes a rounded corner profile.

6. The semiconductor device of claim 1, wherein the semiconductor substrate includes a first region and a second region, the first region including the isolation structure and the conductive layer disposed over the isolation structure, the second region including a memory cell that includes a transistor having a doped feature, the device further comprising:
a first interlayer dielectric (ILD) layer over the conductive layer in the first region and over the memory cell in the second region;
a contact feature within the first ILD layer in the first region, the contact feature being coupled to the doped feature of the transistor; and
a second ILD layer over the first ILD layer in first and second regions;
a first trench that extends at least to the conductive layer in the first region and a second trench that extends to the contact feature in the second region;
a bottom metal layer over the second ILD partially filling in the first and second trenches, portions of the bottom metal layer having been removed outside of the first and second trenches, the bottom metal layer in the first trench being part of the first bottom electrode of the MIM capacitor;
dielectric layer over the second ILD layer partially filling in the first and second trenches, the dielectric layer in the first trench being part of the dielectric of the MIM capacitor; and
a top metal layer over the dielectric layer partially filling in the first and second trenches, the top metal layer in the first trench being part of the top electrode of the MIM capacitor.

7. The device of claim 6, further comprising:
an etch stop layer over the first ILD layer in the second region and above the contact feature, but not in the second trench.

8. The device of claim 6, wherein the first trench extends through the conductive layer and at least to the isolation structure.

9. The device of claim 6, wherein the first trench includes a modified corner profile.

10. The semiconductor device of claim 1, wherein a portion of the bottom electrode physically contacts a portion of the conductive layer.

11. The semiconductor device of claim 1, wherein the top electrode extends to at least to a top surface of the conductive layer.

12. The semiconductor device of claim 1, wherein the isolation structure is a shallow trench isolation structure.

13. A semiconductor device, comprising:
a semiconductor substrate including a first region and a second region;
an isolation structure formed in the first region;
a first MIM capacitor formed over the isolation structure in the first region, the first MIM capacitor having a crown shape that includes a first top electrode, a first bottom electrode, and a dielectric disposed between the first top electrode and the first top electrode;
a memory cell formed in the second region, the memory cell including a second MIM capacitor, the second MIM capacitor having a crown shape that includes a second top electrode, a second bottom electrode, and the dielectric disposed between the second top electrode and the second bottom electrode;
wherein the first bottom electrode of the first MIM capacitor is disposed a first distance from the substrate and the second bottom electrode of the second MIM capacitor is disposed a second distance from the substrate, the first distance being less than the second distance,
wherein the first bottom electrode extends through the conductive layer and at least to a top surface of the isolation structure.

14. The semiconductor device of claim 13, wherein the semiconductor substrate further includes a third region;
wherein the semiconductor device further includes a plurality of CMOS transistors formed in the third region, the CMOS transistors forming part of a logic circuit.

15. The semiconductor device of claim 13, wherein the memory cell includes an embedded DRAM cell, the embedded DRAM cell further including:
a transistor having a doped feature; and
a contact for coupling the second bottom electrode to the doped feature of the transistor.

16. The semiconductor device of claim 13, further comprising a conductive layer formed over the isolation structure in the first region;
wherein the first bottom electrode of the first MIM capacitor extends at least to a top surface of the conductive layer.

17. The semiconductor device of claim 16, wherein the conductive layer includes a doped polysilicon layer;

wherein the semiconductor device further includes a silicide layer formed on the doped polysilicon layer.

18. The semiconductor device of claim 13, wherein the first bottom electrode extends through the conductive layer and through a portion of the isolation structure.

19. A semiconductor device, comprising:
a semiconductor substrate;
an isolation structure disposed in the semiconductor substrate;
a conductive layer disposed over the isolation structure; and
a metal-insulator-metal (MIM) capacitor disposed over the isolation structure, the MIM capacitor having a crown shape that includes a top electrode, a first bottom electrode, and a dielectric disposed between the top electrode and the first bottom electrode, the first bottom electrode extending at least to a top surface of the conductive layer,
wherein the first bottom electrode extends through the conductive layer and at least to a top surface of the isolation structure.

20. The semiconductor device of claim 19, wherein the first bottom electrode extends through the conductive layer and through a portion of the isolation structure.

* * * * *